United States Patent [19]

Bernardoni et al.

[11] Patent Number: 5,457,610
[45] Date of Patent: Oct. 10, 1995

[54] LOW PROFILE MECHANICAL INTERCONNECT SYSTEM HAVING METALIZED LOOP AND HOOP AREA

[75] Inventors: Lonnie L. Bernardoni, Boca Raton; Thomas J. Swirbel, Davie, both of Fla.

[73] Assignee: Motorola, Inc., Schaumburg, Ill.

[21] Appl. No.: 69,318

[22] Filed: Jun. 1, 1993

[51] Int. Cl.$^6$ ............................. H05K 9/00; H05K 1/14
[52] U.S. Cl. ................. 361/816; 361/818; 361/736; 361/752; 174/35 R; 174/35 MS; 174/250; 174/256; 174/260; 174/261
[58] Field of Search ....................... 361/724, 728, 361/730, 816–818, 736, 739, 748, 752, 760–764; 174/35 R, 35 MS, 250, 256, 260–261

[56] References Cited

U.S. PATENT DOCUMENTS

| | | | |
|---|---|---|---|
| 4,429,348 | 1/1984 | Dean | 361/752 |
| 4,432,838 | 2/1984 | Kadija | 204/11 |
| 4,760,859 | 8/1988 | Brown | 137/84 |
| 5,012,114 | 4/1991 | Sisson, Jr. | 250/519.1 |
| 5,111,354 | 5/1992 | Marzi et al. | 361/218 |
| 5,136,119 | 8/1992 | Leyland | 174/35 R |
| 5,136,470 | 8/1992 | Sheridon et al. | 361/749 |

*Primary Examiner*—Bot L. Ledynh
*Attorney, Agent, or Firm*—M. Mansour Ghomeshi

[57] ABSTRACT

A substrate (100) includes a surface (102) having a hook and loop fastener area (106). The area (106) is selectively metallized to produce interconnect points (108). The area (106) is used to attach a connector, another substrate, or a flex circuit to the substrate (100) without the use of solder or other conductive adhesives. The area (106) provides for the mechanical coupling. The selectively metallized areas (108) provide for the electrical coupling of the two substrates.

6 Claims, 3 Drawing Sheets

LOW PROFILE MECHANICAL INTERCONNECT SYSTEM HAVING METALIZED LOOP AND HOOP AREA

FIELD OF THE INVENTION

This invention is related in general to mechanical interconnect systems and more particularly to mechanical interconnect systems for communication devices.

BACKGROUND OF THE INVENTION

Flexible interconnect assemblies are used in electronic devices to interconnect external connectors to internal Printed Circuit (PC) boards or interconnect two PC boards together. These interconnect assemblies, commonly referred to in the industry as "flex circuit", are expensive. In addition to the cost, the handling of flex circuits and their use in electronic devices requires delicate assembly processes further adding to the cost of the overall product in which they are used. Electronic devices, in particular, portable communication devices require flex circuits in order to maintain portability with added functionality. The added complexity of electronic devices has added to the complexity of flex circuits making them more expensive and more difficult to incorporate. A new interconnection assembly is therefore desired.

In addition to flex circuits, communication devices utilize various shields in order to curtain radio frequencies interferences. To maintain their shielding integrity, these shields are soldered to PC boards. The soldering of the shields hampers the successful inspection of the components beneath the shield. In the event of a problem, the shield must be removed using desoldering techniques. These techniques require high temperatures which often result in the movement of components under the shields. It can therefore be seen that a shield is highly desired that does not pose a significant detriment to the reparability of PC boards.

SUMMARY OF THE INVENTION

Briefly, in accordance with the invention, a substrate is disclosed having a surface. The surface of the substrate includes a loop and hook fastener area which is selectively metallized. With the selectively metallized loop and hook fastener area, an interconnect assembly having the same type of metallized loop and hook fastener may be attached to the substrate both mechanically and electrically without the use of solder or other adhesive agents.

DESCRIPTION OF THE PREFERRED EMBODIMENT

Figure 1:
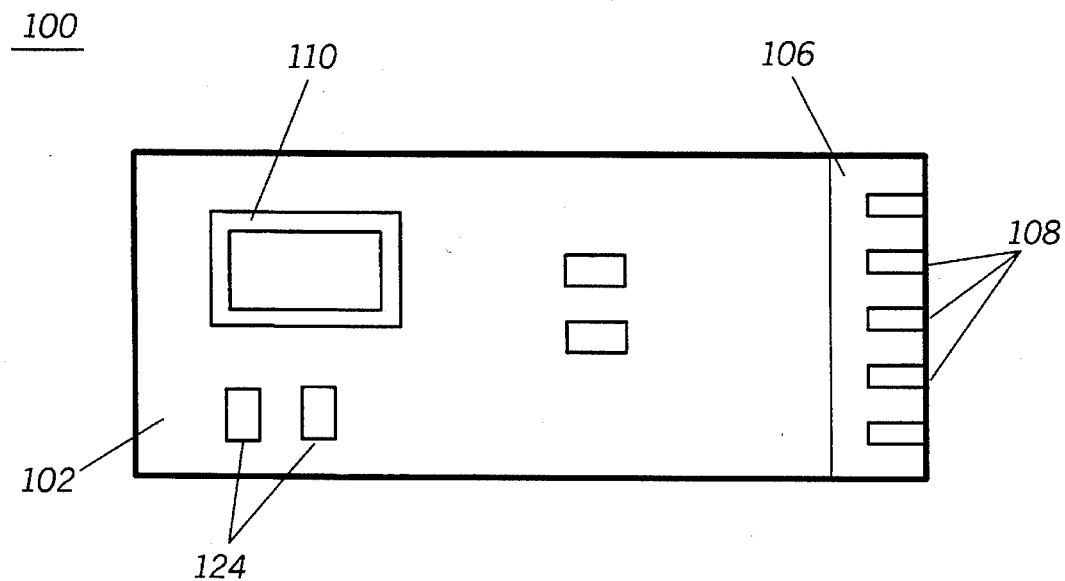
FIG. 1 shows a circuit carrying substrate in accordance with the present invention.

Referring to FIG. 1, a circuit carrying substrate 100 in accordance with the present invention is shown. The substrate 100 includes a surface 102 having a hook and loop fastener, such as Velcro™, area 106. The area 106 is selectively metallized to produce contact points 108. The contact points 108 are used to connect the substrate 100 to other substrates via an interconnect assembly having selectively metallized hook and loop fastener areas as well. The surface 102 includes pads 104 and a shield contact area 110. The areas 104 and 110 are also selectively metallized loop and hook fastener whereby components may be attached for ease of assembly. The pads 104 may be used for a variety of components that have metallized hooks and loop fasteners. The shield contact area 110 may be used for shields that have metallized loop and hook fasteners as well. The interconnect pad 108 may be in a form of a circuit pattern on the area 106. In other words the loops and hooks may be selectively metalized to produce a desired circuit pattern. The remainder of the surface 102 may be used for conventional components or a mixture components with and without the loop and hook fasteners. In order to selectively metallize the area 106 or the pads 104, or the shield pattern 110, a variety of processes including sputtering may be used. In the preferred embodiment, the area 106 is metallized by sputtering a suitable material such as copper on the substrate 102. Other methods of forming a circuit pattern on the loop and hook fastener area is by filling the material with conductive media such as carbon or by electroless plating techniques. Other methods available to produce selective metallization are photolithography and etched techniques, metal liftoff or shadow masking during metal deposition. Yet another method is the application of the loop and hook fastener material to the inner layer laminates during the construction of the printed circuit board. When the final layer is laminated, the hooks (or loops) protrude through the board surface thereby exposing the areas 104 and 110 to provide both mechanical and electrical coupling of components and shield. To selectively metallize small areas, loops and hooks may be made from fine weave fibers. This compensate for the limited surface area yet accomplishes sufficient mechanical coupling.

Figure 2:
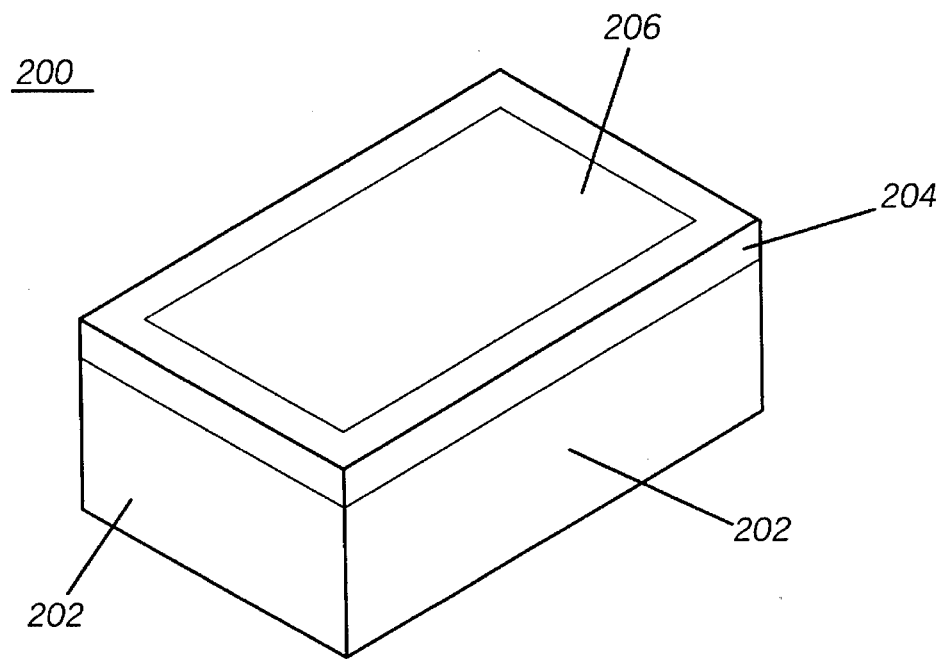
FIG. 2 shows a shield in accordance with the present invention.

Referring to FIG. 2, a shield 200 in accordance with the present invention is shown. The shield 200 includes an enclosure defined by walls 202. The enclosure is preferably metallic, although it could be a plastic shield coated with a layer of metal, such as copper. When desired, a plastic shield may be manufactured to include the loops (or hooks) before it is metalized. This eliminates the need to add a sheet of loop and hook fastener after the molding of the plastic shield. The shields includes an open side 206. On sides 202, a metallized loop and hook sheet 204 is deposited to provide both mechanical and electrical coupling to the surface of a circuit carrying substrate. The area 204 may be adhered to the shield 200 via any well known adhesives such as low temperature solder, conductive epoxies, or conductive pressure sensitive material. The attachment of the shield 200 to a circuit carrying substrate such as the substrate 100 may be accomplished by attaching the loops and hooks of areas 110 and 204. Since both areas are metallized, electrical coupling is accomplished along with the inherent mechanical coupling of the loop and hook fastener areas.

Figure 3:
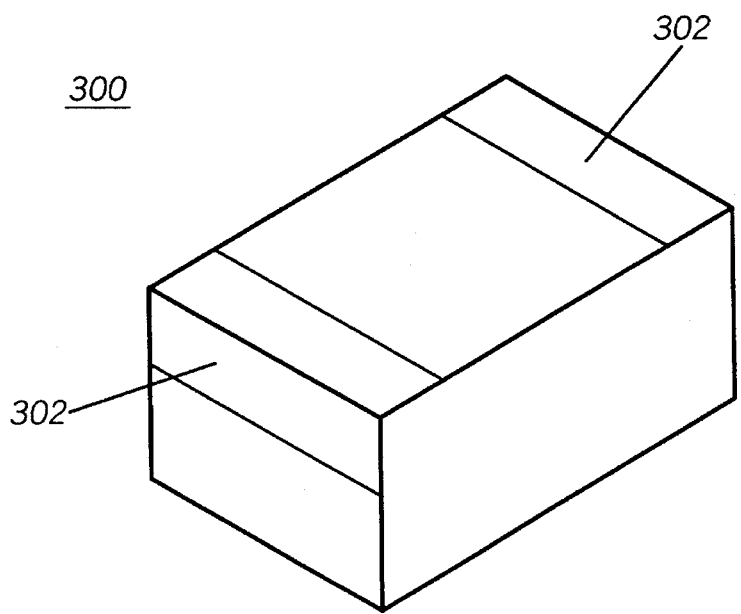
FIG. 3 shows a component in accordance with the present invention.

Referring to FIG. 3, a component 300 in accordance with the present invention is shown. The component 300 includes metallized loops and hook fastener pads 302. These metallized pads may be used to attach the component 300 to a circuit carrying substrate without the use of traditional solder techniques. Pads 104 on the circuit carrying substrate 100 accommodate the loops (or hooks) of the component 300, hence mechanical coupling. Electrical conductivity is accomplished as well since both areas are metallized.

Figure 4:
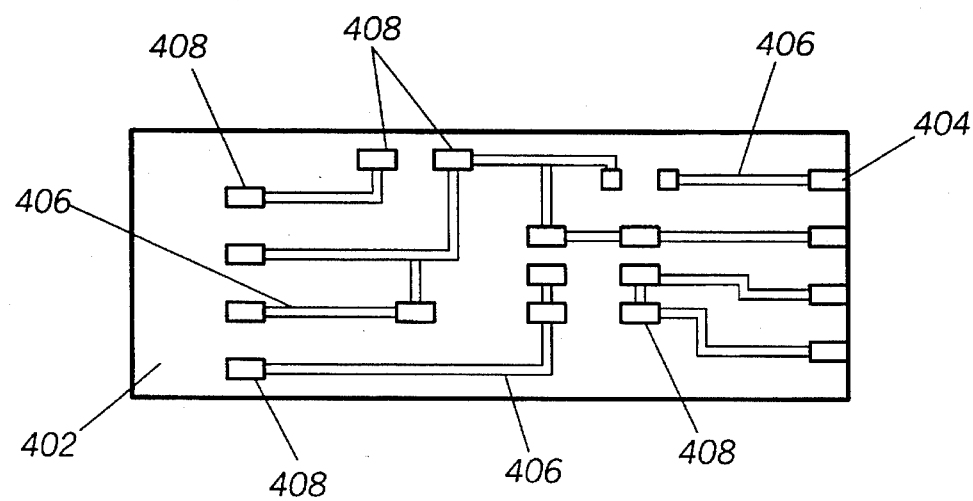
FIG. 4 shows an alternative embodiment of a circuit carrying substrate in accordance with the present invention.

Referring to FIG. 4, a flexible circuit carrying substrate 400 in accordance with the present invention is shown. The substrate 400 includes a hook and loop fastener sheet 402 on which a circuit pattern is printed or deposited. In other words, the area 402 is selectively metallized to conform to a desired circuit pattern. The circuit pattern includes pads 408, runners 406, and interconnect points 404. This flexible metallized sheet may be used as a flex circuit in connecting two circuit carrying substrates together or connecting external connectors to a circuit carrying substrate. Once again, any one of the previously mentioned techniques may be used to selectively metallize the surface area 402.

Figure 5:
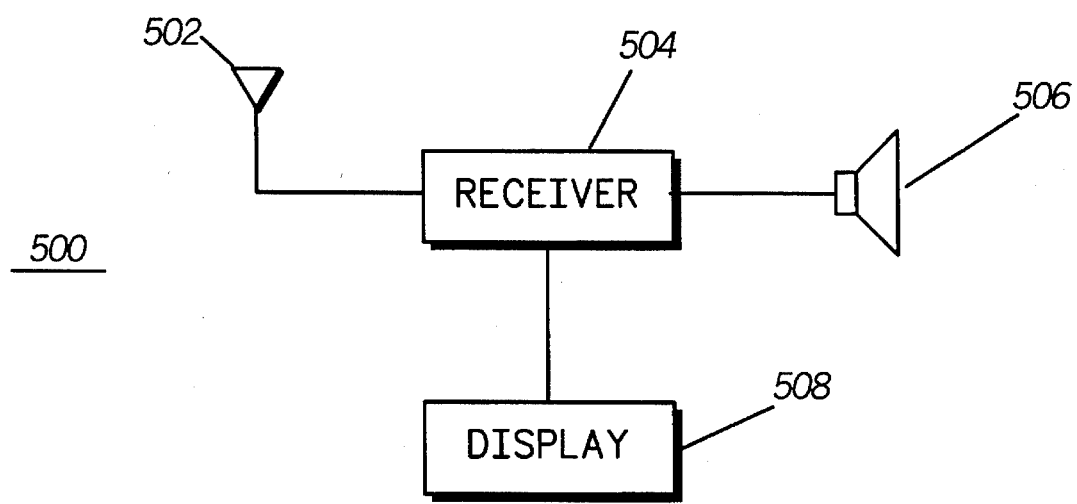
FIG. 5 shows a communication device in accordance with the present invention.

Referring to FIG. 5, a communication device is shown in accordance with the present invention. The communication device 500 includes an antenna 502, which is used to receive radio frequency signals. The signals are coupled to a receiver 504 where they are demodulated and applied to a speaker 506 or a display 508 depending on the nature of the demodulated information. The receiver 504 includes a circuit carrying substrate similar to the circuit carrying substrate 100 or 400. The circuit carrying substrate within the receiver 504 employs a shield, such as the shield 200. The components on the substrate may be similar to 300.

By utilizing the principles of the present invention, a shield having metallized hook and loop fastener may be attached to a circuit carrying substrate without the traditional soldering processes. Such an attachment can easily be undone in the event repair is necessary. The reparability benefits of not having the shield permanently attached to circuit carrying substrate are evident. However, it is noted that this benefit is acquired without the loss of protection against radio frequency interferences. Similarly, a component can be attached to the circuit carrying substrate without the traditional techniques of applying solder. In addition, the use of loop and hook fasteners in the fabrication of a flex circuit provides great flexibility, low cost, ease of handling, and ease of reparability. By having a loop and hook fastener area whereby pads and interconnect points are selectively metallized, one can readily create a simple circuit pattern needed on a flex circuit for the interconnection of circuit carrying substrates to each other and to external connectors.

We claim:

1. A substrate comprising;

a surface having an area with loop and hook fasteners, the loop and hook fastener area having a circuit pattern and being selectively metalized to provide the substrate with simultaneous mechanical and electrical coupling to a second substrate.

2. The substrate of claim 1, wherein the loop and hook fastener area includes an area selectively metalized via a sputtering process.

3. A substrate, comprising:

a surface;

a circuit pattern printed on the surface; and a selectively metalized loop and hook fastener portion attached to the circuit pattern to provide for the mechanical and the electrical coupling of the substrate to a second substrate.

4. The substrate of claim 2, further including a shield attached to the surface via a metalized loop and hook fastener portion.

5. The substrate of claim 4, wherein the circuit pattern includes a metalized loop and hook fastener portion to attach to the shield.

6. The substrate of claim 2, wherein the circuit pattern includes at least one interconnection pad.

* * * * *